(12) United States Patent
Lo et al.

(10) Patent No.: US 11,314,141 B2
(45) Date of Patent: Apr. 26, 2022

(54) ELECTROPHORETIC DISPLAY DEVICE

(71) Applicant: E Ink Holdings Inc., Hsinchu (TW)

(72) Inventors: Po-Yuan Lo, Hsinchu (TW); Tai-Yuan Lee, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/382,226

(22) Filed: Apr. 12, 2019

(65) Prior Publication Data

US 2019/0339582 A1 Nov. 7, 2019

(30) Foreign Application Priority Data

May 4, 2018 (TW) .................................. 107115316

(51) Int. Cl.
| | | |
|---|---|---|
| G02F 1/1677 | (2019.01) | |
| G02F 1/1679 | (2019.01) | |
| G02F 1/16766 | (2019.01) | |
| G02F 1/16755 | (2019.01) | |
| G02F 1/1333 | (2006.01) | |
| G02F 1/1335 | (2006.01) | |
| H01L 51/52 | (2006.01) | |
| H01L 27/32 | (2006.01) | |

(Continued)

(52) U.S. Cl.
CPC .......... *G02F 1/1677* (2019.01); *G02F 1/1336* (2013.01); *G02F 1/133305* (2013.01); *G02F 1/133514* (2013.01); *G02F 1/167* (2013.01); *G02F 1/1679* (2019.01); *G02F 1/16755* (2019.01); *G02F 1/16766* (2019.01); *H01L 27/3232* (2013.01); *H01L 51/0023* (2013.01); *H01L 51/5206* (2013.01); *H01L 51/5225* (2013.01); *H01L 51/5246* (2013.01); *H01L 51/5253* (2013.01); *G02F 1/133302* (2021.01); *G02F 1/133616* (2021.01); *G02F 2201/44* (2013.01); *H01L 2251/308* (2013.01); *H01L 2251/5338* (2013.01)

(58) Field of Classification Search
None
See application file for complete search history.

(56) References Cited

U.S. PATENT DOCUMENTS

| | | |
|---|---|---|
| 7,463,408 B2 | 12/2008 | Johnson et al. |
| 8,027,000 B2 | 9/2011 | French et al. |

(Continued)

FOREIGN PATENT DOCUMENTS

| | | |
|---|---|---|
| TW | 201316304 A | 4/2013 |
| TW | 201502676 A | 1/2015 |

OTHER PUBLICATIONS

Corresponding Taiwan office action dated Apr. 3, 2019.

*Primary Examiner* — Nilufa Rahim
(74) *Attorney, Agent, or Firm* — CKC & Partners Co., LLC

(57) ABSTRACT

An electrophoretic display device includes an electrophoretic display module, and a polymer light emitting diode (PLED) module. The polymer light emitting diode (PLED) module is over the electrophoretic display module, and is aligned with and is attached to the electrophoretic display module. In a dark environment, the polymer light emitting diode (PLED) module can emit light to supplement the insufficient ambient light, so that the users may observe the information or pattern displayed by the electrophoretic display device. The electrophoretic display device can be a flexible electrophoretic display device.

16 Claims, 12 Drawing Sheets

(51) Int. Cl.
  *G02F 1/13357*  (2006.01)
  *G02F 1/167*   (2019.01)
  *H01L 51/00*   (2006.01)

(56) References Cited

U.S. PATENT DOCUMENTS

| | | |
|---|---|---|
| 8,743,077 B1 | 6/2014 | Sprague |
| 2002/0196401 A1* | 12/2002 | Grace ................. H01L 27/3281 |
| | | 349/158 |
| 2005/0012707 A1 | 1/2005 | Liu |
| 2005/0012708 A1 | 1/2005 | Liu |
| 2005/0052122 A1* | 3/2005 | Iwasawa ............ H01L 51/5088 |
| | | 313/504 |
| 2006/0240281 A1* | 10/2006 | Liao ...................... H05B 33/26 |
| | | 428/690 |
| 2007/0069637 A1 | 3/2007 | Jang et al. |
| 2007/0268244 A1* | 11/2007 | Chopra ................. G09G 3/344 |
| | | 345/107 |
| 2010/0167002 A1* | 7/2010 | Chu .................... H01L 51/5256 |
| | | 428/69 |
| 2013/0119352 A1* | 5/2013 | Aurongzeb ......... H01L 51/5225 |
| | | 257/40 |
| 2014/0021463 A1* | 1/2014 | Nakamura .......... H01L 51/5209 |
| | | 257/40 |
| 2014/0113085 A1 | 4/2014 | Busman |
| 2016/0097881 A1* | 4/2016 | Yang ................... H01L 51/5281 |
| | | 359/488.01 |
| 2016/0252752 A1 | 9/2016 | Busman et al. |
| 2016/0276601 A1* | 9/2016 | Choi ..................... H01L 51/508 |
| 2017/0031227 A1* | 2/2017 | Lo ............................. G02F 1/00 |
| 2017/0220150 A1* | 8/2017 | Wu ..................... H01L 27/3248 |
| 2018/0040853 A1 | 2/2018 | Chen |
| 2019/0198584 A1* | 6/2019 | Chen .................... H01L 51/003 |
| 2019/0219514 A1* | 7/2019 | Atkinson ........... G01N 21/8806 |

\* cited by examiner

ELECTROPHORETIC DISPLAY DEVICE

CROSS-REFERENCE TO RELATED APPLICATION

This application claims priority to Taiwan Application Serial Number 107115316, filed May 4, 2018, which is herein incorporated by reference.

BACKGROUND

Field of Invention

The present invention relates to an electrophoretic display device.

Description of Related Art

The electrophoretic display device has been widely used as display screens for electronic products in today's consumer electronics market. Since the electrophoretic display device is a reflective display device, the electrophoretic display device itself does not emit light, and it relies on external light source. Once the electrophoretic display device is located in an environment with weak ambient light, the electrophoretic display device cannot display images clearly.

Conventional electrophoretic display devices generally use a front-light source or an additional light source as an auxiliary light source when the ambient light is insufficient. The front-light source normally utilizes a light emitting diode (LED) and a light guide plate to guide the light to the electrophoretic display device. However, the front-light source must be attached to an electrophoretic display module by an adhesive such as optical clear adhesive (OCA). As a result, the issues of bubbles and attaching stress at the interface easily occur. Further, the light emitting diode and the light guide plate have a certain thickness, such that the thickness of the electrophoretic display device cannot be reduced. Moreover, it is difficult for the front-light source to provide uniform illumination to the large-sized electrophoretic display device. Besides, the additional light source is quite inconvenient to use.

SUMMARY

In accordance with an aspect of the present invention, an electrophoretic display device is provided. The electrophoretic display device includes an electrophoretic display module, and a polymer light emitting diode (PLED) module. The polymer light emitting diode (PLED) module is over the electrophoretic display module, and is aligned with and attached to the electrophoretic display module.

According to some embodiments of the present invention, the electrophoretic display device further includes a first waterproof layer between the polymer light emitting diode module and the electrophoretic display module, a second waterproof layer over the polymer light emitting diode module, and a sealant surrounding and covering a sidewall of the polymer light emitting diode module.

According to some embodiments of the present invention, the first waterproof layer and the second waterproof layer include glass, polystyrene (PS), or polyethylene terephthalate (PET).

According to some embodiments of the present invention, the electrophoretic display module includes an array substrate, a display medium layer over the array substrate, and a front substrate between the display medium layer and the polymer light emitting diode module.

According to some embodiments of the present invention, the array substrate and the front substrate include a flexible substrate or a rigid substrate.

According to some embodiments of the present invention, the flexible substrate includes polyimide (PI), polyethylene terephthalate (PET), Polyethylene naphthalate (PEN), polyamide (PA), epoxy, polycarbonate (PC), or polymethyl methacrylate (PMMA).

According to some embodiments of the present invention, the rigid substrate includes glass.

According to some embodiments of the present invention, the display medium layer includes an electrophoresis liquid and at least two types of charged particles dispersed in the electrophoresis liquid. One of the two types of the charged particles has a color that is different from another one of the two types of the charged particles, and the charged particles are selected from a group consisting of a plurality of red particles, a plurality of green particles, a plurality of yellow particles, a plurality of blue particles, a plurality of black particles and a plurality of white particles.

According to some embodiments of the present invention, the electrophoretic display device further includes a color filter layer between the polymer light emitting diode module and the electrophoretic display module.

According to some embodiments of the present invention, the color filter layer includes a red color resist, a green color resist, and a blue color resist.

According to some embodiments of the present invention, the polymer light emitting diode module includes a substrate, an anode layer, a hole transport layer, a polymer light-emitting layer, an electron transport layer, and a cathode layer.

According to some embodiments of the present invention, the substrate includes glass, polyimide (PI), polyethylene terephthalate (PET), polyethylene naphthalate (PEN), polyamide (PA), epoxy, polycarbonate (PC), or polymethyl methacrylate (PMMA).

According to some embodiments of the present invention, the anode layer includes Indium Tin Oxide (ITO).

According to some embodiments of the present invention, the cathode layer includes metal or alloy, and the cathode layer has a plurality of holes, wherein each of the holes has a diameter of about 10-40 μm.

According to some embodiments of the present invention, a distance between the holes is about 25-50 μm.

According to some embodiments of the present invention, each of the holes has a round, an elliptical, a drop-shaped, a rectangular, or a polygonal contour.

According to some embodiments of the present invention, the electrophoretic display device further includes a protective film over the electrophoretic display module, wherein the protective film includes an anti-glare film, an anti-reflective film, a UV blocking film, a moisture blocking film, or an anti-scratch film.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
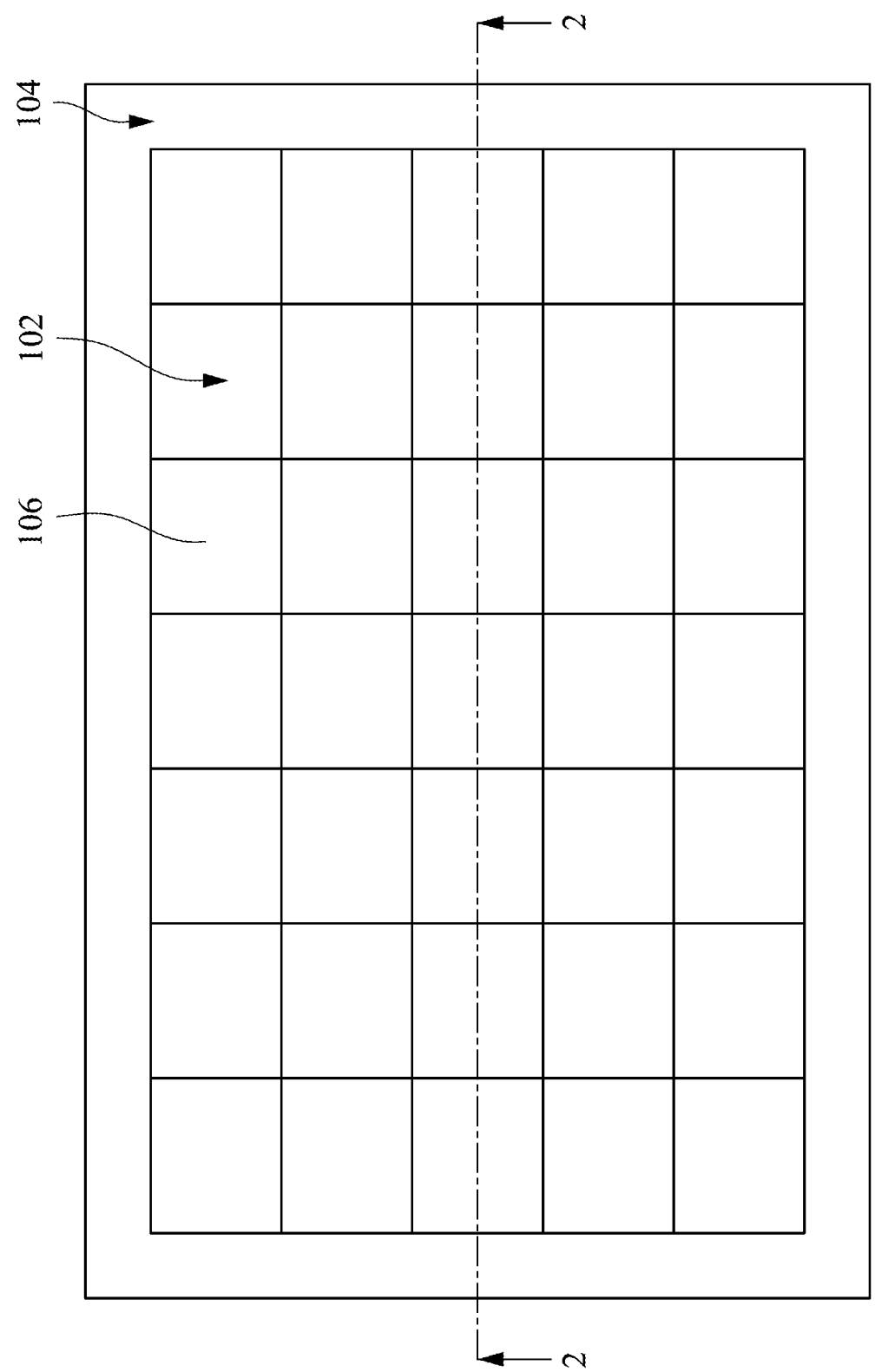
FIG. 1 is a top view of an electrophoretic display device in accordance with various embodiments of the present invention.

Reference will now be made in detail to the present embodiments of the invention, examples of which are illustrated in the accompanying drawings. Wherever possible, the same reference numbers are used in the drawings and the description to refer to the same or like parts.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 2:
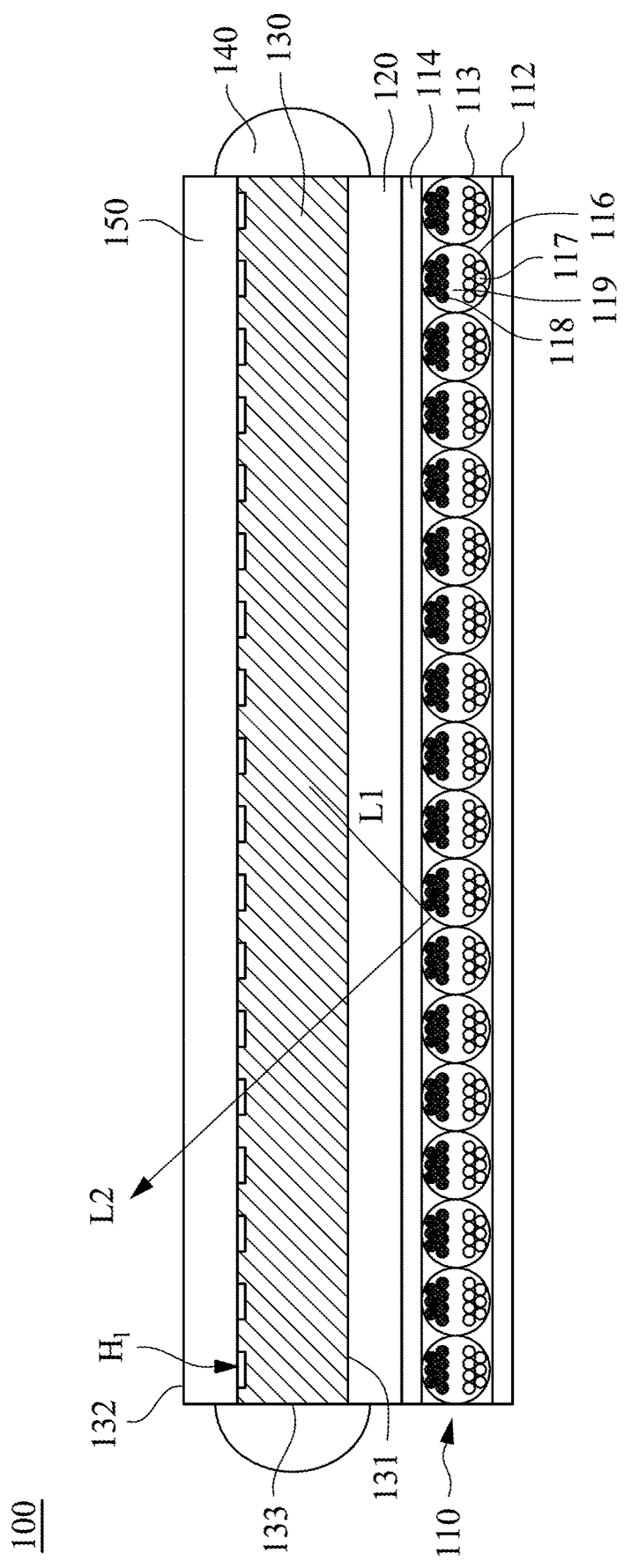
FIG. 2 is a cross-sectional view of an electrophoretic display device in accordance with some embodiments of the present invention.

FIG. 1 is a top view of an electrophoretic display device 100 in accordance with various embodiments of the present invention. FIG. 2 is a cross sectional view along line 2-2 of FIG. 1. Reference is made to FIG. 1, the electrophoretic display device 100 may include a display area 102 and an non-display area 104. The display area 102 may include a plurality of pixel units 106. As shown in FIG. 2, the electrophoretic display device 100 includes an electrophoretic display module 110, a first waterproof layer 120, a polymer light emitting diode (PLED) module 130, a sealant 140 and a second waterproof layer 150. The first waterproof layer 120, the PLED module 130 and the second waterproof layer 150 are attached to the electrophoretic display module 110 in sequence, and the sealant 140 surrounds and covers a sidewall 133 of the PLED module 130. The PLED module 130 completely covers the underneath electrophoretic display module 110 in a top view.

Still referring to FIG. 2, according to some embodiments of the present invention, the electrophoretic display module 110 includes an array substrate 112, a display medium layer 113 and a front substrate 114. The display medium layer 113 between the front substrate 114 and the array substrate 112 can reflect light. In some embodiments, the display medium layer 113 has a plurality of microcapsules 116, and each of the microcapsules 116 has electrophoresis liquid 119 and at least two types of charged particles dispersed in the electrophoresis liquid 119. In some embodiments, one of the two types of the charged particles has a color different from another one of the two types of the charged particle. In some embodiments, the electrophoretic display device 100 may be black-and-white electrophoretic display device, and the microcapsules 116 may include a plurality of white charged particles 117 and a plurality of black charged particles 118. In other embodiments, the electrophoretic display device 100 may be a color electrophoretic display device, and the microcapsules 116 may include four kinds of charged particles (not shown in FIG. 2). The four kinds of charged particles have different colors from each other, and the four kinds of charged particles are selected from a group consisting of red particles, green particles, yellow particles, blue particles, black particles and white particles. In some embodiments, the electrophoretic display device 100 includes red particles, yellow particles, blue particles and white particles. In some embodiments, the microcapsules 116 may be substituted by microcups.

According to some embodiments, the array substrate 112 and the front substrate 114 may include flexible substrate or rigid substrate. More specifically, when the electrophoretic display device 100 is a flexible electrophoretic display device, the array substrate 112 and the front substrate 114 are flexible substrate. In some embodiments, the flexible substrate includes but not limited to polyimide (PI), polyethylene terephthalate (PET), polyethylene naphthalate (PEN), polyamide (PA), epoxy, polycarbonate (PC), or polymethyl methacrylate (PMMA). In some embodiments, the rigid substrate may include but not limited to glass. In some embodiments, the array substrate 112 may include thin film transistors (TFT).

Figure 4A:
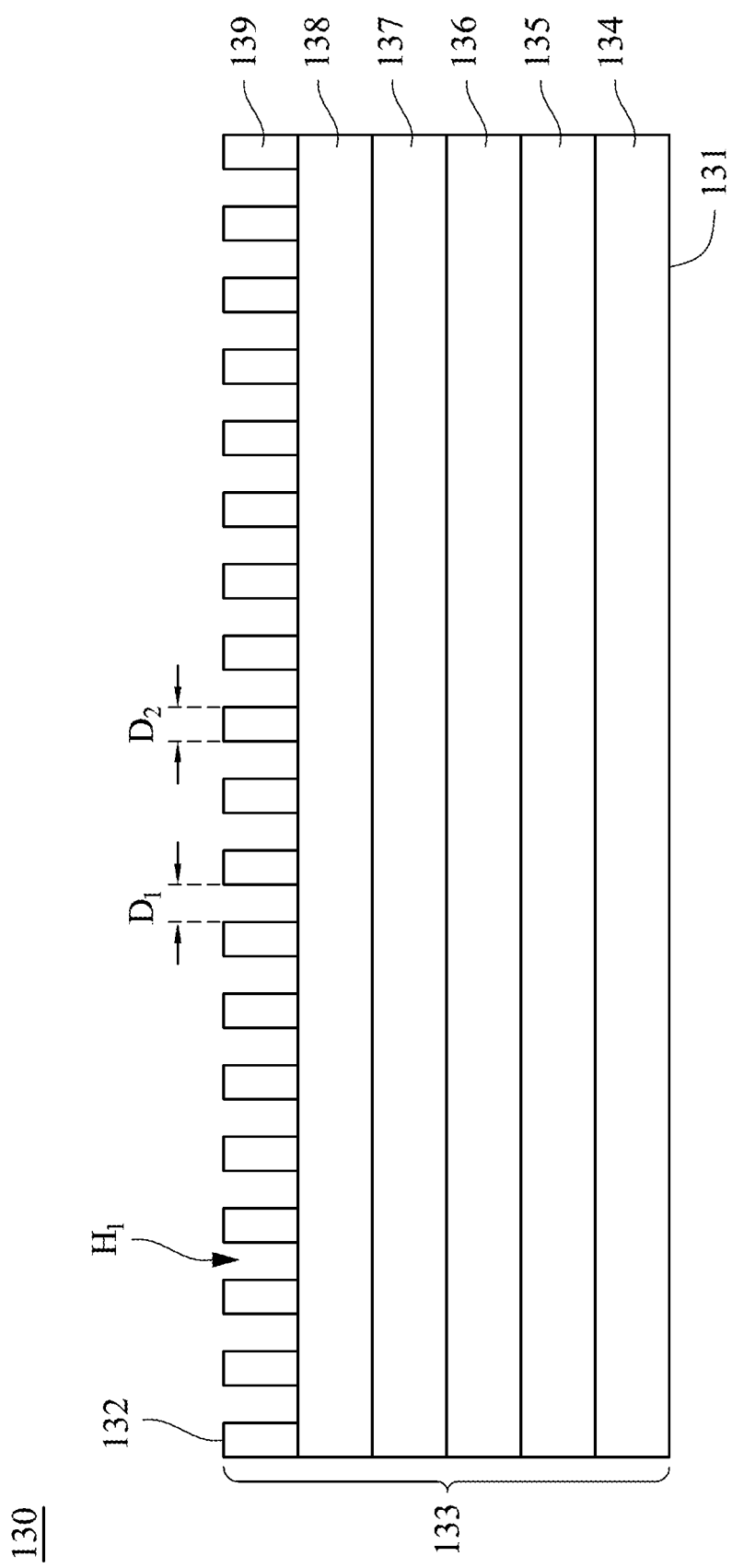
FIG. 4A is a cross-sectional view of a polymer light emitting diode (PLED) module of an electrophoretic display device in accordance with some embodiments of the present invention.
Figure 4B:
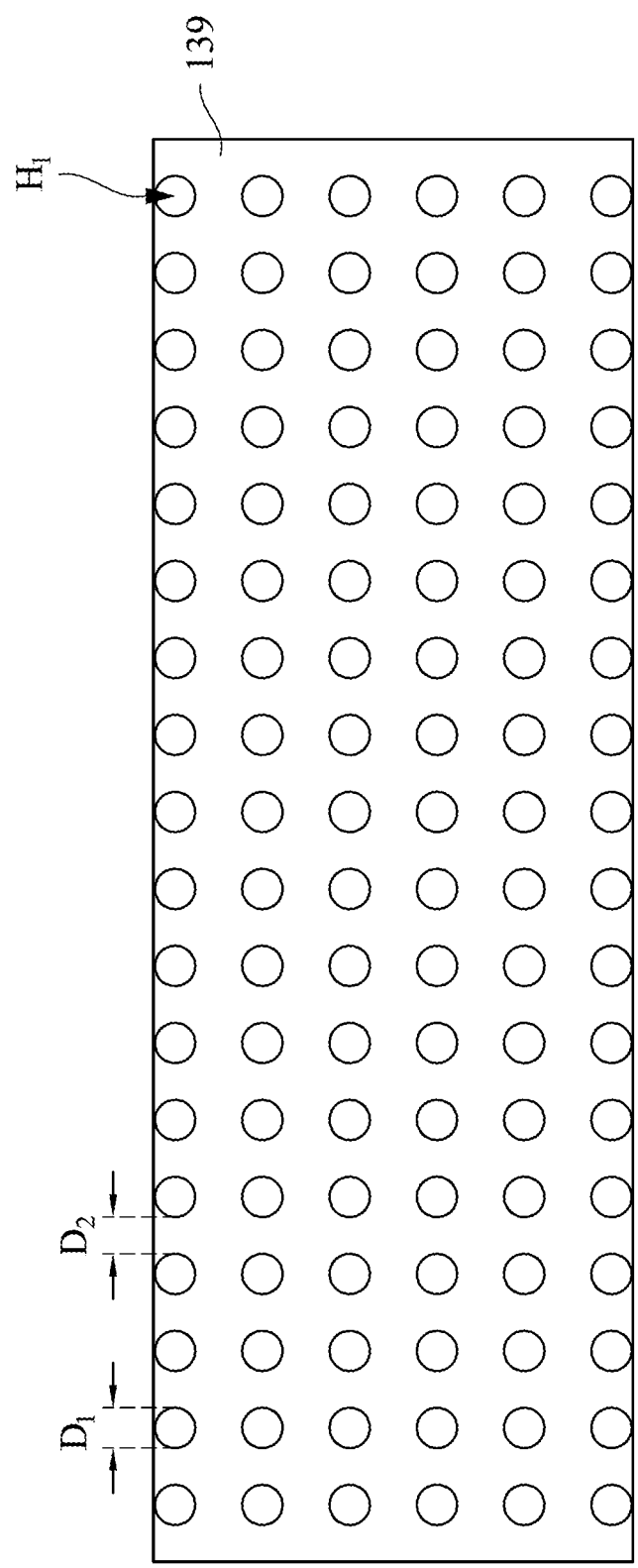
FIG. 4B is a top view of a polymer light emitting diode (PLED) module of an electrophoretic display device in accordance with various embodiments of the present invention.

FIG. 4A is a cross-sectional view of a polymer light emitting diode (PLED) module 130 in accordance with various embodiments of the present invention. FIG. 4B is a top view of a polymer light emitting diode (PLED) module 130 in accordance with some embodiments of the present invention. First, referring to FIG. 2 and FIG. 4A, the polymer light emitting diode (PLED) module 130 is over the electrophoretic display module 110, and the PLED module 130 is attached to and is roughly aligned with the electrophoretic display module 110. The polymer light emitting diode (PLED) module 130 has a bottom surface 131, a top surface 132, and a sidewall 133. According to some embodiments, the polymer light emitting diode (PLED) module 130 may include a substrate 134, an anode layer 135, a hole transport layer (HTL) 136, a polymer light emitting layer 137, an electron transport layer (ETL) 138, and a cathode layer 139 stacked in sequence on the electrophoretic display module 110.

In some embodiments, the anode layer 135 is close to the electrophoretic display module 110, and is positioned on the substrate 134 of the polymer light emitting diode (PLED) module 130, as depicted in FIG. 4A. In some embodiments, the cathode layer 139 is close to the second waterproof layer 150, and is positioned on the top of the polymer light emitting diode (PLED) module 130. According to some embodiments, the substrate 134 may include glass, polyimide (PI), polyethylene terephthalate (PET), polyethylene naphthalate (PEN), polyamide (PA), epoxy, polycarbonate (PC), or polymethyl methacrylate (PMMA). According to some embodiments, the anode layer 135 may be transparent electrode, which includes but not limited to indium tin oxide (ITO) or other suitable transparent conductive materials. According to some embodiments, the cathode layer 139 may be opaque electrode, which may include metal or alloy. For example, the cathode layer 139 may be but not limited to aluminum, lithium, silver, barium, indium, or other suitable metals or alloys. Reference is made to FIGS. 4A-4B. According to some embodiments, the cathode layer 139 has a plurality of holes H1. In some embodiments, each of the holes H1 has a diameter D1 of about 10-40 µm, for example, may be about 15, 20, 25, 30, or 35 µm. In some embodiments, a distance D2 between the adjacent holes H1 is about 25-50 µm, for example may be about 30, 35, 40, 45, or 50 µm. In some embodiments, the holes H1 take about 10-50% area of the cathode layer 139, for example, about 15, 20, 25, 30, 35, 40, or 45%. In some embodiments, each of the holes H1 may include but not limited to a round, an elliptical, a drop-shaped, a rectangular, or a polygonal contour in a plan view. In some embodiments, the holes H1 may be arranged in a matrix arrangement or a honeycomb arrangement, but it is not limited thereto. The diameter D1 and the distance D2 mentioned above can provide a better light transmittance and an improved distribution of light intensity for the electrophoretic display device 100.

The polymer light emitting layer 137 may include any suitable conjugated polymers. In some embodiments, the polymer light emitting layer 137 may be formed on the glass substrate by spin coating or ink jet printing, but is not limited thereto. Compare with organic light emitting diode (OLED), the manufacturing process of the PLED module 130 is simpler, more effective, and lower cost since the polymer light emitting diode (PLED) module 130 may be formed by coating methods. Therefore, the PLED module 130 is more advantageous to be applied to a large-sized display device.

The polymer light emitting diode (PLED) module 130 is self-luminous. When a voltage is applied to the PLED module 130, electrons are injected into the electron transport layer 138 from the cathode layer 139, and electron holes are injected into the hole transport layer 136 from the anode layer 135. Then, the electrons and the electron holes recombine in the polymer light emitting layer 137 to emit light. When the polymer light emitting diode (PLED) module 130 is attached to the electrophoretic display module 110, the user can operate the electrophoretic display device 100 without external light source by the self-luminous property of the PLED module 130. More specifically, as shown in FIG. 2, after the incident light L1 emitted from the PLED module 130 enters the electrophoretic display module 110 through the bottom surface 131 of the PLED module 130, the incident light L1 is reflected by the display medium layer 113 and a reflect light L2 is generated. The reflect light L2 then passes through the hole H1 of the cathode layer 139 of the PLED module 130 to a viewer out of the electrophoretic display device 100.

In some embodiments, the polymer light emitting diode (PLED) module 130 does not emit light when no current is applied to the PLED module 130. Therefore, the display medium layer 113 of the electrophoretic display module 110 only reflects the incident light from the ambient environment. More specifically, the polymer light emitting diode (PLED) module 130 can be used for an auxiliary light source in the electrophoretic display device 100. When ambient light source is insufficient, the polymer light emitting diode (PLED) module 130 can be turned on to emit light, such that the users can observe the information or pattern displayed by the electrophoretic display device 100. On the contrary, when ambient light source is sufficient, the polymer light emitting diode (PLED) module 130 can be turned off to avoid power consumption. The light emitted from the PLED module 130 provides high intensity uniformity, so that the electrophoretic display device 100 can obtain uniform illumination to provide a good visual experience to the users.

Reference is still made to FIG. 2 and FIG. 4A. According to some embodiments, the sealant 140 covers the sidewall 133 of the PLED module 130. More specifically, the sealant 140 covers a side surface of the anode layer 135, a side surface of the hole transport layer 136, a side surface of the polymer light emitting layer 137, a side surface of the electron transport layer 138 and a side surface of the cathode layer 139. In some embodiments, the sealant 140 may include UV curing adhesive. The sealant 140 may be coated by any suitable method such as screen printing, ink jet printing, offset printing, relief printing, gravure printing, dispensing process, or the like, and then be cured by the UV. In some embodiments, the sealant 140 may include epoxy, but is not limited thereto. In some embodiments, the sealant 140 may further cover a side surface of the interface between the PLED module 130 and the first waterproof layer 120 (i.e., the bottom surface 131), and a side surface of the interface between the PLED module 130 and the second waterproof layer 150 (i.e., the top surface 132). The PLED module 130 is sealed between the first waterproof layer 120, the second waterproof layer 150 and the sealant 140 to block moisture entering the PLED module 130, so that this configuration can protect the PLED module 130 and prevent the PLED module 130 from oxidation and degradation caused by moisture.

Reference is still made to FIG. 2. The first waterproof layer 120 is under the bottom surface 131 of the PLED module 130, and the second waterproof layer 150 is over the top surface 132 of the PLED module 130. According to some embodiments, the first waterproof layer 120 and the second waterproof layer 150 may include but not limited to glass, polystyrene (PS), or polyethylene terephthalate (PET). In some embodiments, the electrophoretic display device 100 may further include a protective film on the second waterproof layer 150 or integrated in the waterproof layer 150. The protective film may include an anti-glare film, an anti-reflective film, a UV blocking film, or an anti-scratch film.

In the following description, other electrophoretic display devices according to yet some embodiments will be described. It is understood that the relationship between the elements and the material of the components described above will not be repeated hereafter.

Figure 3:
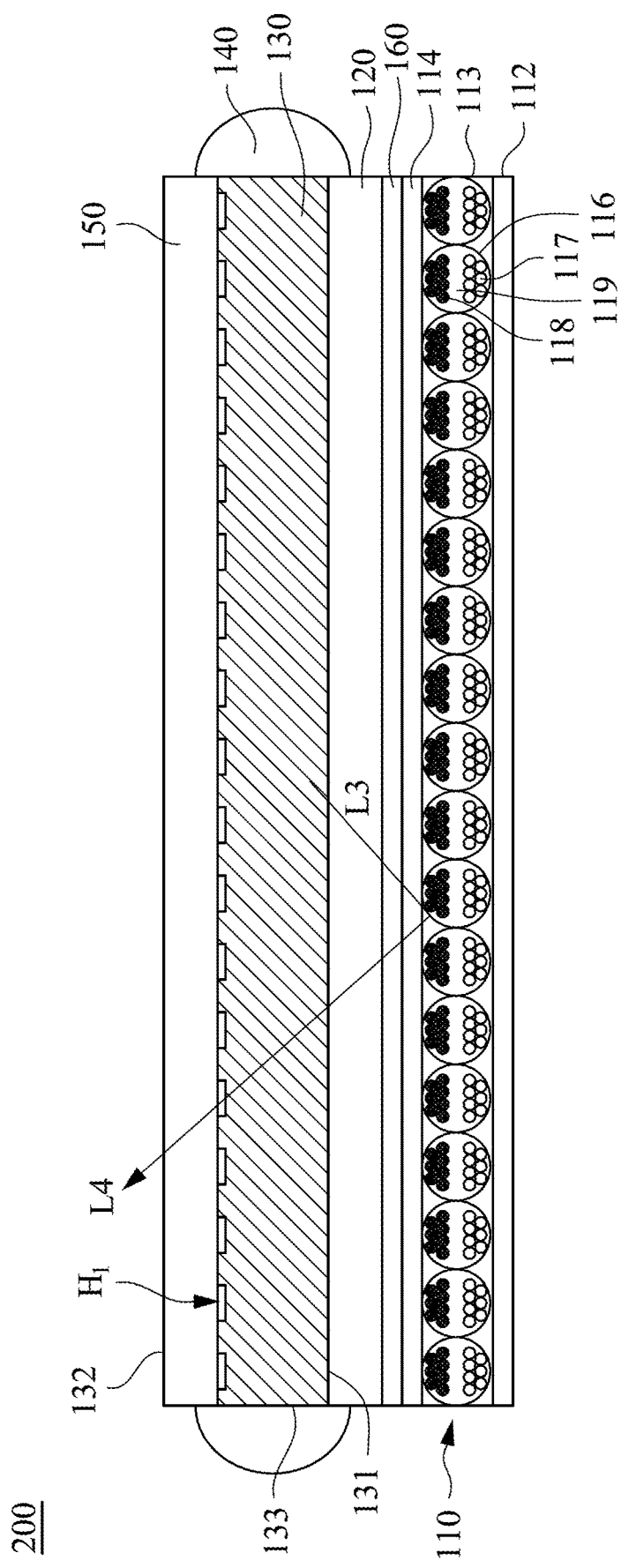
FIG. 3 is a cross-sectional view of an electrophoretic display device in accordance with some embodiments of the present invention.

FIG. 3 is a cross-sectional view of an electrophoretic display device 200 in accordance with some embodiments of the present invention. The electrophoretic display device 200 may include an electrophoretic display module 110, a first waterproof layer 120, a polymer light emitting diode (PLED) module 130, a sealant 140, a second waterproof layer 150 and a color filter layer 160. The difference between the electrophoretic display device 200 and the electrophoretic display device 100 shown in FIG. 2 is in that the electrophoretic display device 200 further includes the color filter layer 160 between the electrophoretic display module 110 and the first waterproof layer 120. According to some embodiments, the color filter layer 160 may include but not limited to red color resist, green color resist and blue color resist. In some embodiments, the electrophoretic display device 200 may be a color electrophoretic display device, and the microcapsule 116 may include a plurality of white charged particles 117 and a plurality of black charged particles 118. As shown in FIG. 3, as an incident light L3 emitted from the PLED module 130 enters the electrophoretic display module 110 through the bottom surface 131 of the PLED module 130, the incident light L3 passes through the color filter layer 160 and reaches the display medium layer 113. The incident light L3 is reflected by the display medium layer 113, and therefore a reflect light L4 is generated. The reflect light L4 then passes through the color resists in the color filter layer 160 so that the reflect light L4 has color. The reflect light L4 then is transmitted through the hole H1 of the cathode layer 139 of the PLED module 130 to a viewer out of the electrophoretic display device 200.

Figure 5A:
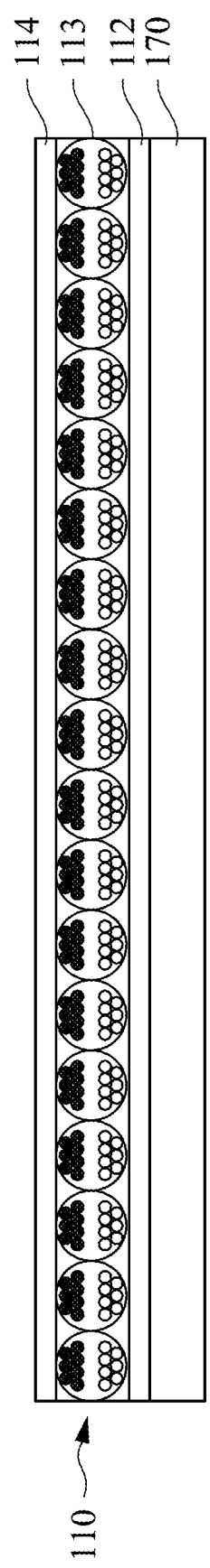
FIGS. 5A-5C are cross-sectional view illustrating one of the various stages of manufacturing an electrophoretic display device.
Figure 5B:
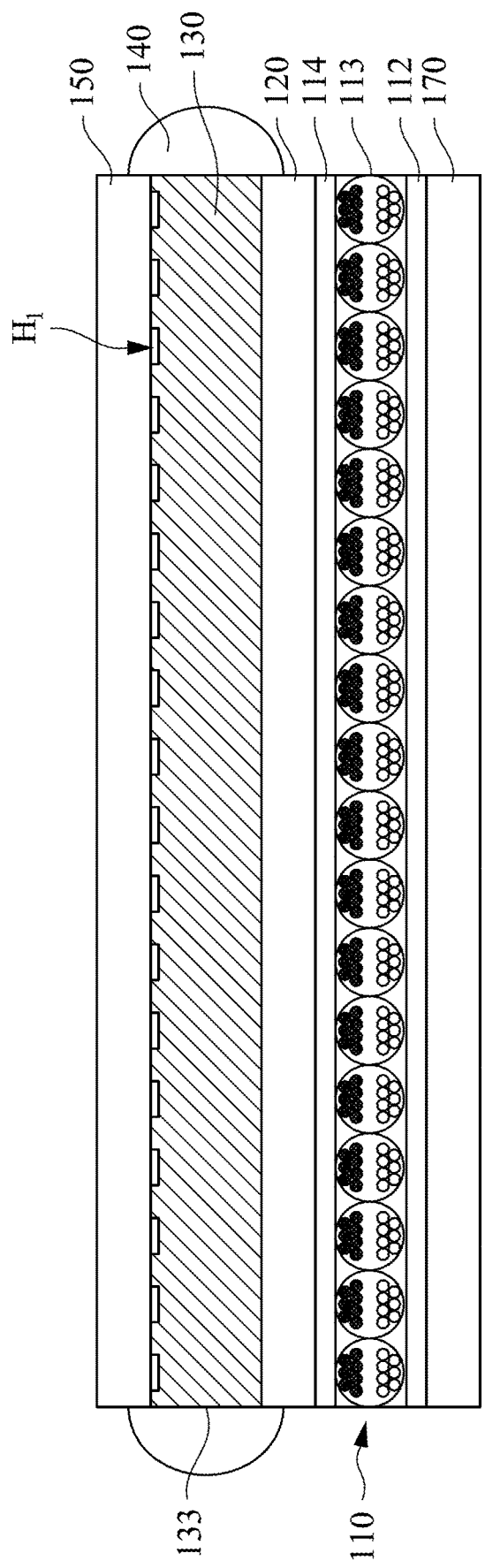
Figure 5C:
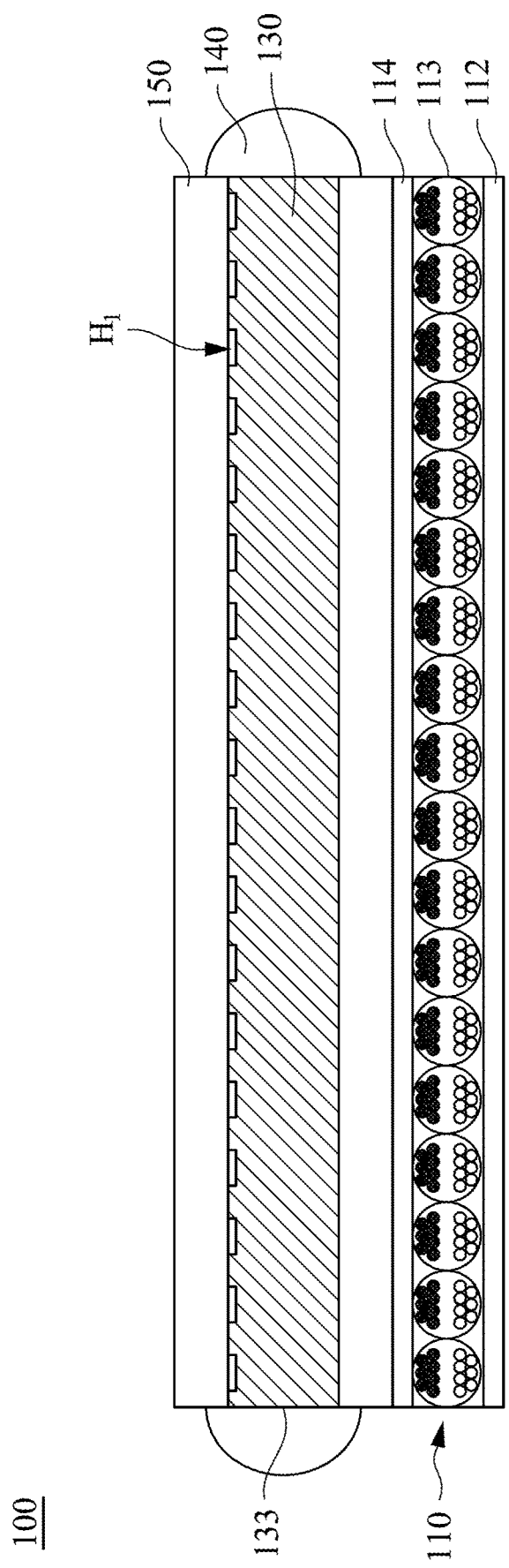

FIGS. 5A-5C are cross-sectional views illustrating various stages in the method for manufacturing the electrophoretic display device 100 shown in FIG. 2. The electrophoretic display device 100 may be a flexible electrophoretic display device. Referring to FIG. 5A, the electrophoretic display module 110 is formed on a carrier structure 170. The electrophoretic display module 110 may include the array substrate 112, the display medium layer 113 and the front substrate 114. The array substrate 112 and the front substrate 114 are flexible substrates. The materials of the flexible substrate have been described above, and will not be repeated hereafter. In some embodiments, the carrier structure 170 may include a glass substrate, but is not limited thereto. The carrier structure 170 may include any suitable rigid material.

Referring to FIG. 5B, the first waterproof layer 120, the polymer light emitting diode (PLED) module 130 and the second waterproof layer 150 are formed on the electrophoretic display module 110 in sequence. The substrate 134, the anode layer 135 and the cathode layer 139 of the PLED module 130 (shown in FIG. 4A) are flexible, and the sealant 140 surrounds and covers the sidewall 133 of the PLED module 130. In this stage, the electrophoretic display device 100 illustrated in FIG. 2 has been formed on the carrier structure 170. As shown in FIG. 5C, in some embodiments, the electrophoretic display device 100 is then taken from the carrier structure 170 by a physically peeling manner to obtain the electrophoretic display device 100 shown in FIG. 2.

Figure 6A:
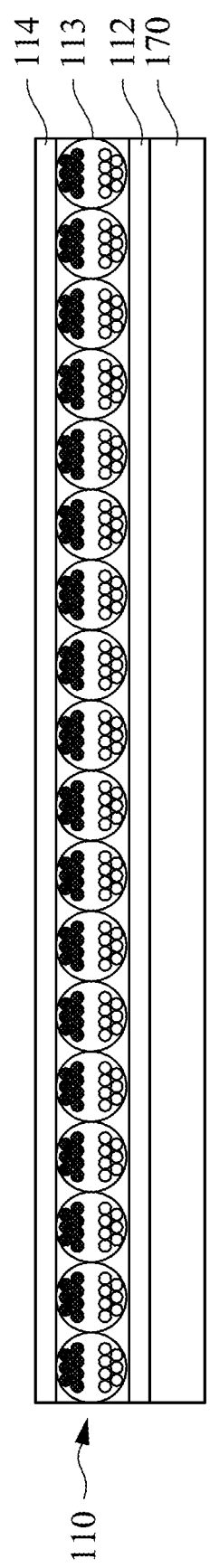
FIGS. 6A-6D are cross-sectional view illustrating one of the various stages of manufacturing an electrophoretic display device.

FIGS. 6A-6D are cross-sectional views illustrating various stages in the method for manufacturing the electrophoretic display device 200 shown in FIG. 3. The electrophoretic display device 200 may be a flexible electrophoretic display device. Referring to FIG. 6A, the electrophoretic display module 110 is formed on the carrier structure 170. The electrophoretic display module 110 may include the array substrate 112, the display medium layer 113 and the front substrate 114, and the array substrate 112 and the front substrate 114 may be flexible substrate. The materials of the flexible substrate and the carrier structure 170 have been described above, and will not be repeated hereafter.

Figure 6B:
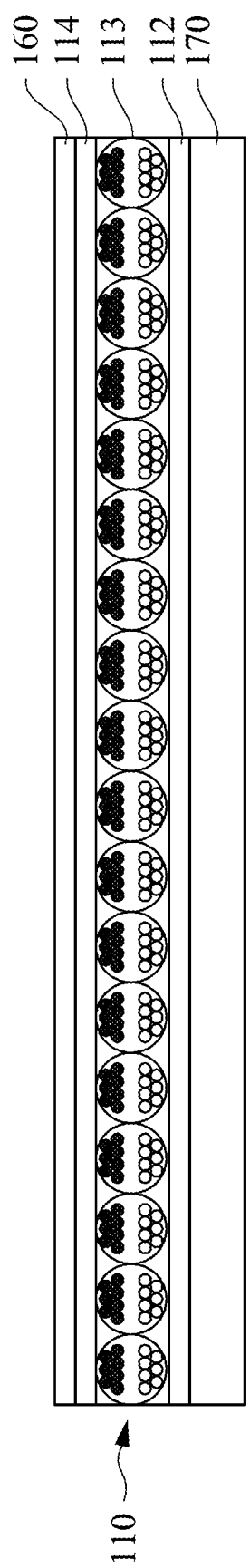
Figure 6C:
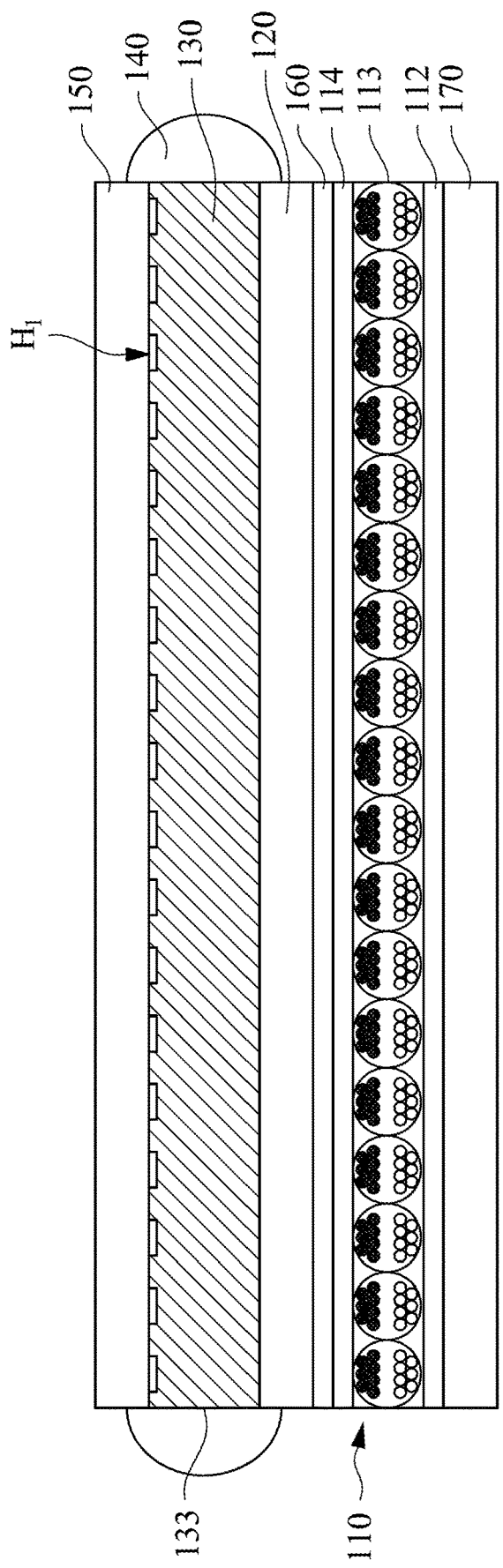
Figure 6D:
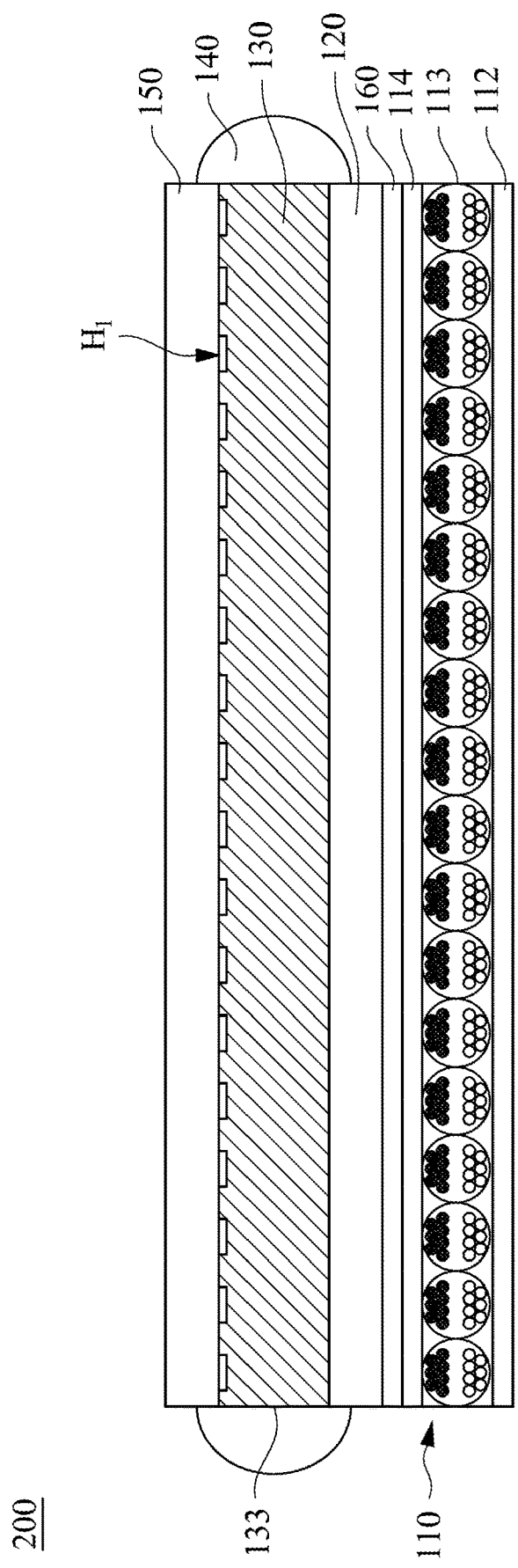

Referring to FIG. 6B, the color filter layer 160 is formed on the electrophoretic display module 110. According to some embodiments, the color filter layer 160 may be any suitable color filter layer with flexibility. As shown in FIG. 6C, the first waterproof layer 120, the PLED module 130 and the second waterproof layer 150 are formed on the electrophoretic display module 110 in sequence. The substrate 134, the anode layer 135 and the cathode layer 139 of the PLED module 130 (shown in FIG. 4A) are flexible, and the sealant 140 surrounds and covers the sidewall 133 of the PLED module 130. In this stage, the electrophoretic display device 200 illustrated in FIG. 3 has been formed on the carrier structure 170. As shown in FIG. 6D, in some embodiments, the electrophoretic display device 200 is then taken from the carrier structure 170 by a physically peeling manner to obtain the electrophoretic display device 200 shown in FIG. 3.

As described above, according to the embodiments of the present invention, the electrophoretic display device includes an electrophoretic display module and a polymer light emitting diode (PLED) module. The electrophoretic display module is roughly aligned with and is attached to the PLED module. The electrophoretic display device of the present invention can be operated without external light source because of the self-luminous property of the PLED module. The PLED module may be configured to emit light or not to emit light. For example, in a dark environment, the PLED module can be turned on to emit light to provide sufficient light, so that the users can observe the information or pattern displayed by the electrophoretic display device. On the contrary, in a bright environment, the PLED module can be turned off to avoid power consumption of the electrophoretic display device. The PLED module and the electrophoretic display module only need to be roughly aligned, such that the manufacturing process is simple and the manufacturing cost is low. The PLED module has a thin thickness, thereby the thickness of the electrophoretic display device can be reduced. Moreover, the PLED module can provide uniform illumination to the electrophoretic display device and therefore can improve the brightness and the light intensity uniformity of the electrophoretic display device. Accordingly, the electrophoretic display device can be applied to a large-sized electrophoretic display device, for example, an outdoor billboard.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electrophoretic display device, comprising:
an electrophoretic display module; and
a polymer light emitting diode (PLED) module over the electrophoretic display module, wherein the polymer light emitting diode module is aligned with and is attached to the electrophoretic display module, wherein the polymer light emitting diode module comprises:
a substrate;
an anode layer, disposed on the substrate;
a hole transport layer, disposed on the anode layer;
a polymer light-emitting layer, disposed on the hole transport layer;
an electron transport layer, disposed on the polymer light-emitting layer; and
a cathode layer made of metal or alloy, disposed on the electron transport layer, wherein the cathode layer has a plurality of holes and is directly in contact with the electron transport layer, and a plurality of vertical projections on the substrate of the plurality of holes are separated from each other, wherein the cathode layer is continuously and integrally formed.

2. The electrophoretic display device of claim 1, wherein the electrophoretic display module comprising:

an array substrate;

a display medium layer over the array substrate; and a front substrate between the display medium layer and the polymer light emitting diode module.

3. The electrophoretic display device of claim 2, wherein the array substrate and the front substrate comprise a flexible substrate or a rigid substrate.

4. The electrophoretic display device of claim 3, wherein the flexible substrate comprises polyimide (PI), polyethylene terephthalate (PET), Polyethylene naphthalate (PEN), polyamide (PA), epoxy, polycarbonate (PC), or polymethyl methacrylate (PMMA).

5. The electrophoretic display device of claim 3, wherein the rigid substrate comprises glass.

6. The electrophoretic display device of claim 2, wherein the display medium layer comprises:

an electrophoresis liquid; and at least two types of charged particles dispersed in the electrophoresis liquid, wherein one of the two types of the charged particles has a color that is different from another one of the two types of the charged particles, and the charged particles are selected from a group consisting of a plurality of red particles, a plurality of green particles, a plurality of yellow particles, a plurality of blue particles, a plurality of black particles and a plurality of white particles.

7. The electrophoretic display device of claim 1, further comprising a color filter layer between the polymer light emitting diode module and the electrophoretic display module.

8. The electrophoretic display device of claim 7, wherein the color filter layer comprises a red color resist, a green color resist, and a blue color resist.

9. The electrophoretic display device of claim 1, wherein the substrate comprises glass, polyimide (PI), polyethylene terephthalate (PET), polyethylene naphthalate (PEN), polyamide (PA), epoxy, polycarbonate (PC), or polymethyl methacrylate (PMMA).

10. The electrophoretic display device of claim 1, wherein the anode layer comprises indium tin oxide (ITO).

11. The electrophoretic display device of claim 1, wherein each of the holes has a diameter of about 10-40 μm.

12. The electrophoretic display device of claim 11, wherein a distance between adjacent ones of the holes is about 25-50 μm.

13. The electrophoretic display device of claim 11, wherein each of the holes has a round, an elliptical, a drop-shaped, a rectangular, or a polygonal contour.

14. The electrophoretic display device of claim 1, further comprising a protective film over the electrophoretic display module, wherein the protective film comprises an anti-glare film, an anti-reflective film, a UV blocking film, a moisture blocking film, or an anti-scratch film.

15. The electrophoretic display device of claim 1, further comprising:

a first waterproof layer between the polymer light emitting diode module and the electrophoretic display module;

a second waterproof layer over the polymer light emitting diode module; and a sealant surrounding the polymer light emitting diode module and covering a first interface between the polymer light emitting diode module and the first waterproof layer and a second interface between the polymer light emitting diode module and the second waterproof layer.

16. The electrophoretic display device of claim 15, wherein the first waterproof layer and the second waterproof layer comprise glass, polystyrene (PS), or polyethylene terephthalate (PET).

* * * * *